United States Patent [19]
Marino

[11] 4,110,748
[45] Aug. 29, 1978

[54] KEYSWITCH WITH HYSTERESIS

[75] Inventor: Francis C. Marino, Dix Hills, N.Y.

[73] Assignee: Burroughs Corporation, Detroit, Mich.

[21] Appl. No.: 674,215

[22] Filed: Apr. 6, 1976

[51] Int. Cl.² .......................... H01G 5/01; G08C 25/00
[52] U.S. Cl. ........................... 340/365 C; 200/DIG. 1; 307/351; 307/353; 328/151; 340/365 R; 340/365 E; 340/347 SH
[58] Field of Search ............ 340/365 R, 365 S, 365 C, 340/347 SH, 365 E; 200/DIG. 1; 317/255, 256; 307/235 C, 353, 360, 351, 362; 328/151; 84/DIG. 7; 361/300, 291, 288; 324/60 C, 60 CD

[56] References Cited

U.S. PATENT DOCUMENTS

| | | | |
|---|---|---|---|
| 3,631,472 | 12/1971 | Lincoln | 340/365 C |
| 3,631,473 | 12/1971 | Yakata et al. | 340/365 E |
| 3,691,555 | 9/1972 | Looschen | 340/365 C |
| 3,717,818 | 2/1973 | Herbst | 307/235 C |
| 3,750,113 | 7/1973 | Cencel | 340/365 C |
| 3,815,127 | 6/1974 | Blumke et al. | 340/365 S |
| 3,912,988 | 10/1975 | Levesque et al. | 200/DIG. 1 |
| 3,918,051 | 11/1975 | Bernin et al. | 340/365 E |
| 3,943,812 | 3/1976 | Nagai et al. | 340/365 C |
| 3,982,236 | 9/1976 | Kafafian | 340/365 S |

FOREIGN PATENT DOCUMENTS

2,229,406  1/1973  Fed. Rep. of Germany ....... 340/365 C

OTHER PUBLICATIONS

Williams, IBM Technical Disclosure Bulletin, "Touch-Sensing Circuit," Jun. 1974, pp. 166–167.

Primary Examiner—John W. Caldwell, Sr.
Assistant Examiner—James J. Groody
Attorney, Agent, or Firm—Hane, Roberts, Spiecens & Cohen

[57] ABSTRACT

In a keyboard there are a plurality of key operated variable capacitor switches acting as differentiators to change the widths of electrical pulses which are then integrated to give signals whose level indicate which switches have been operated. The gain and operating points of amplifiers can be changed to change the transfer function of the electronics and thus increase the mechanical hysteresis of the switches.

10 Claims, 9 Drawing Figures

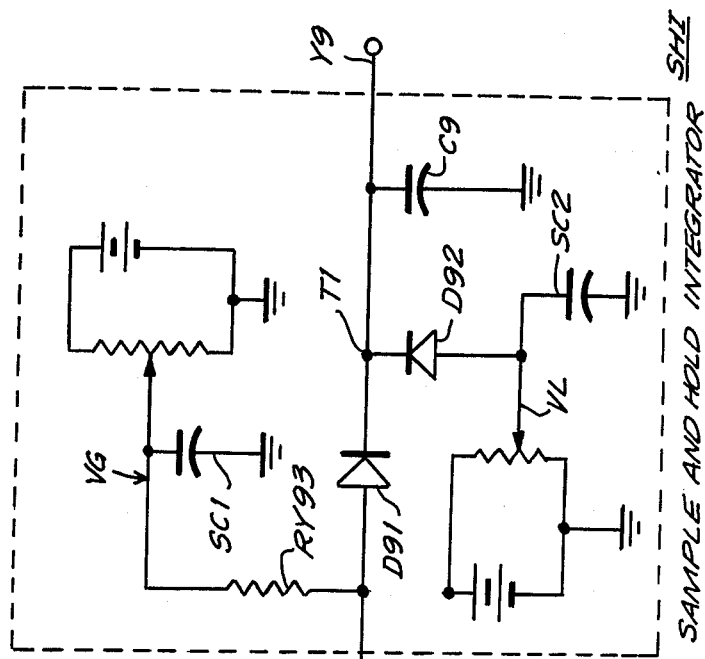
FIG. 4
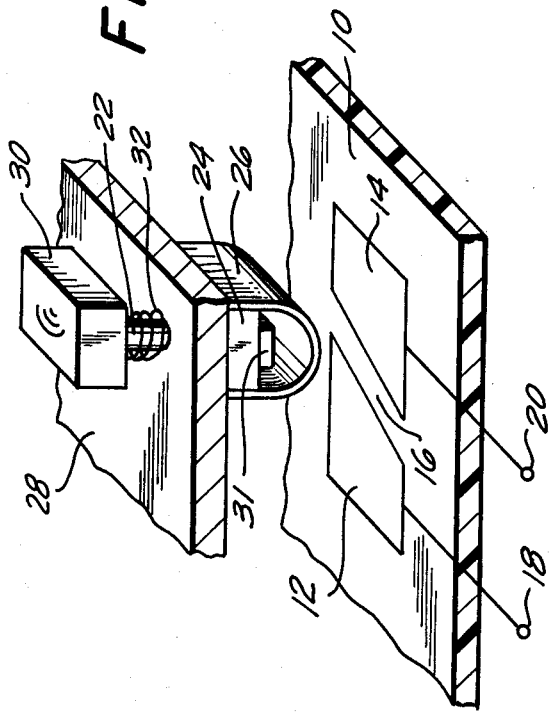
FIG. 5
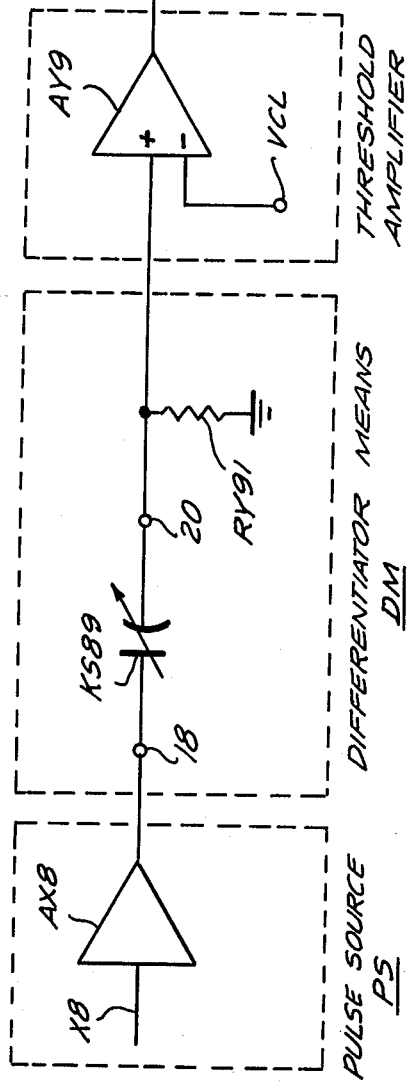

KEYSWITCH WITH HYSTERESIS

BACKGROUND OF THE INVENTION

The invention pertains to keyboards and more particularly to keyboards using key switches to control electrical signals.

Key switches can be used for many control and selection functions on devices such as typewriters, telephone handsets and calculators. The keyboards of such devices, since they control electronic signals, try to avoid the use of mechanical make and break contact switches because of their complexity, unreliability and cost. Thus, these keyboards utilize a variety of transducers to perform the switching operation. People have tried to use mechanically operated reed switches, Hall effect devices, photoelectronic devices and capacitive techniques. However, all of these electronic keyboard switches have less mechanical hysteresis than conventional "over-center" key switches.

Mechanical hysteresis is the phenomenom which occurs when a keyboard is depressed and an electrical signal is generated at a first point (make point) during the downward travel of the key. This signal cannot be generated again until the key is released and travels a certain distance to a second point (break point) above a first point and then travels downward again past the first point. The distance between the first and second points is the mechanical hysteresis. However, it is usually expressed as percentage of total key travel. For example, if the spacing between the first and second points is 0.010 inch and the total possible key travel is 0.20 inch then the key is said to have 5% mechanical hysteresis.

Usually, the make and break points are determined by the make and break levels of a sensing amplifier. Generally, a sensing amplifier in the form of a bistate device is utilized. The bistate device has electronic hysteresis so that the device assumes a first state upon receipt of a signal having a first level (the make level) and assumes a second state when the received signal is at a different (lower) level. The voltage difference between the two levels is the electronic or electrical hysteresis of the device. These first and second levels determine the level of the signals required from the key switch. If the level of the signal transferred from the key switch is a monotonic function of key switch displacement, then the first and second levels of the sensing amplifier fix the make and break points of the key switch.

It should be apparent that for a sensing device having a given electrical or electronic hysteresis one would want a key switch transducer which has a great mechanical travel or hysteresis between the generation of the two different signal levels recognized. The reason is that the larger the mechanical hysteresis the smaller is the probability of emitting more than one signal from a single operation of the key switch transducer.

Of the many key switch devices, it has been found that capacitive switch devices (wherein the key acts as a coupling element between two coplanar pads) characteristically have the smallest mechanical hysteresis properties. In spite of this poor mechanical hysteresis property of conventional capacitive switch devices, they afford the greatest economy of manufacture since they rely on the positions of conductive elements that are easily printed on substrates. Therefore, it is highly desirable to utilize capacitive switch devices in multi-switch arrays such as keyboards.

SUMMARY OF THE INVENTION

An object of a first aspect of the invention is to increase the mechanical hysteresis of a transducer which is connected to a sensor having a fixed electronic hysteresis.

Another object of this aspect of the invention is to provide a method of increasing the operative mechanical travel of a key device which monotonically modulates the amplitude of a signal transmitted to a signal sensor having a fixed electronic hysteresis.

An object of another aspect of the invention is to provide an improved method of controlling the transfer of signals by the travel of a key switch.

Another object of this aspect is the utilization of variable capacitors to control such transfer.

Another object of the invention is to provide an improved capacitive key switch assemblage to implement the other objects of the invention.

Briefly, the invention contemplates a method for increasing the mechanical hysteresis of a key switch by decreasing the transfer gain associated with the signal amplitude modulation of a signal transferred to a signal sensor by the key switch and adding a constant direct voltage to the transferred signal before receipt by the signal sensor.

Concurrent with this aspect of the invention there is contemplated the method of controlling the transfer of signals by means of the travel of a key switch between two points along a path by generating packets of pulses, modulating the widths or durations of the pulses in the packets in accordance with the instantaneous position of the key switch along the path, and generating a signal whose amplitude is a function of the durations of the width-modulated pulses.

The signal transfer controlling method is carried out by a key switch assemblage which width modulates the pulses by utilizing a signal differentiator having a capacitor whose capacitance is controlled by the travel of a key switch.

BRIEF DESCRIPTION OF THE DRAWINGS

Other objects, the features and advantages of the invention will be apparent from the following detailed description when read with the accompanying drawing wherein:

FIG. 4 is a more detailed schematic of one of the switch circuits of FIG. 3;

FIG. 5 is a perspective view of one of the key switches of the matrix of FIG. 3;

DESCRIPTION OF THE PREFERRED EMBODIMENT

Figure 1A:
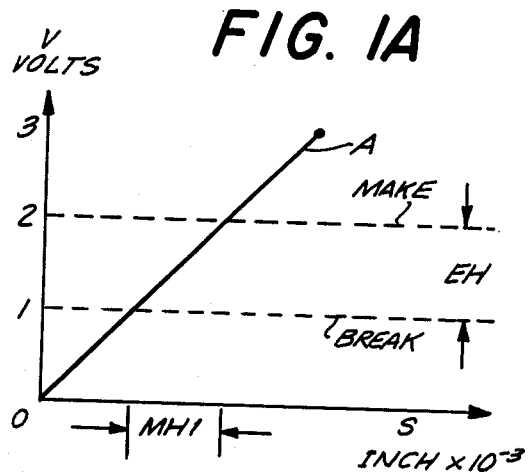
FIGS. 1a to c show three graphs of transducer characteristics of output voltage as a function of switch travel.

In FIG. 1a there is shown the transfer characteristic OA of a key switch transducer. The transducer has a gain of $p$ volts per inch of travel, for example 1 volt per 0.033 inch of travel, that is, for over a given range of travel the signal transmitted by the transducer will change at the rate of 1 volt per 1/30 inch of travel of the key stem of the switch. Usually, the output of the key switch transducer is connected to a signal sensor which has a fixed electronic hysteresis EH of $m$ volts as determined by the separation of the make and break voltage levels of the sensor. For example, the make voltage level can be 2 volts and the break voltage level 1 volt. The difference between these levels is 1 volt. Therefore, the key switch makes at .066 inches and breaks at 0.033 inches of travel with a mechanical hysteresis MH1 of 0.033 inches of travel.

In order to increase the mechanical hysteresis or the displacement between make and break, the gain has been decreased to 1 volt per 0.100 inches of travel. However, as can be seen the transferred signal level never reaches the make level of 2 volts.

Figure 1B:
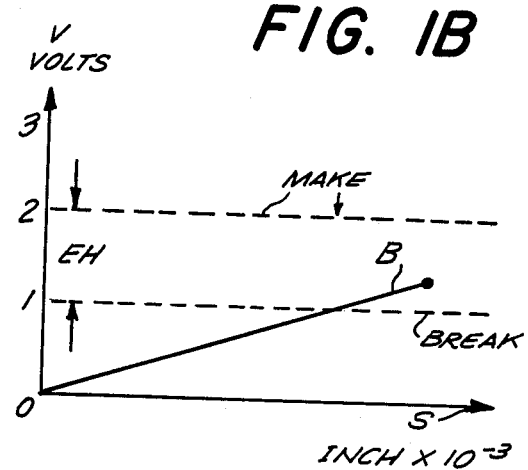
Figure 1C:
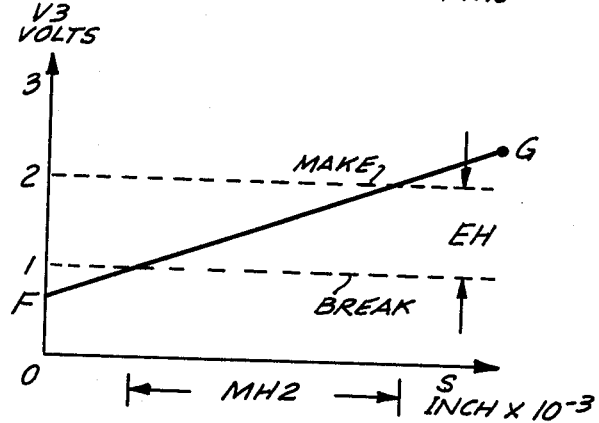

In order to achieve the result it is necessary to add a DC component to the transferred signal. Thus in FIG. 1c there is shown the transfer characteristic FG having the same gain as characteristic OB of FIG. 1b, but with an added DC component of 0.67 volts. Now, the switch makes at 0.132 inches of travel and breaks at 0.033 inches of travel for a mechanical hysteresis of 0.099 inches of travel or three times the previous mechanical hysteresis.

This method of translating a fixed electronic hysteresis to different mechanical hysteresis can be used with various key switch assemblages. There will first be shown its use in a capacitive keyboard system.

Figure 2:
FIG. 2 is a block diagram of a capacitive keyboard system including a keyboard switch matrix utilizing different aspects of the invention.
Figure 2:
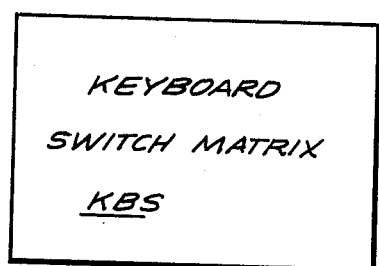

The system of FIG. 2 includes a processor PRO interfaced via a keyboard encoder read-only memory KEM to a keyboard switch matrix KBS.

The processor PRO can be any conventional data processor which can accept serial characters wherein the characters are coded combinations of up to 9 bits in parallel from pins P5 to P14 under control of a signal on pin P16 of the memory KEM. In addition, it can send signals to pins P28 and P29 of the memory to control the type of encoding such as case shift to be employed by the memory. Since the processor PRO forms no part of the invention it will be described no further.

The memory KEM can be one of many off-the-shelf encoders. A typical encoder is the MTNS Keyboard Encoder Read Only Memory AY-5-3600 of General Instrument Corporation. The memory KEM has pins corresponding to those of the General Instrument AY-5-3600 chip.

In addition to the pins already recited, pins P1 to P5 are optional features not needed for the present invention, pins P15, P27 and P30 receive operating voltages specified by the manufacturers such as $V_{DD}=OV$, $V_{GG}=12V$, and $V_{CC}=+5V$. Connected to pin P31 is a timing capacitor having a typical value of 0.01 $\mu F$.

For the invention the remaining pins are important. The pins P32 to P40 are connected respectively via lines X8 to X0 to nine row lines of the keyboard switch matrix KBS. The memory KEM emits a packet of, say, eight pulses from each of the pins P32 to P40 in sequence, i.e., pin P32 first emits eight pulses then pin P33, etc. The pins P17 to P26 are connected via lines Y0 to Y9 to ten column lines of switch matrix KBS. The pins P17 to P26 are sequentially connected to a sense amplifier within the chip which has an electronic hysteresis.

Figure 3:
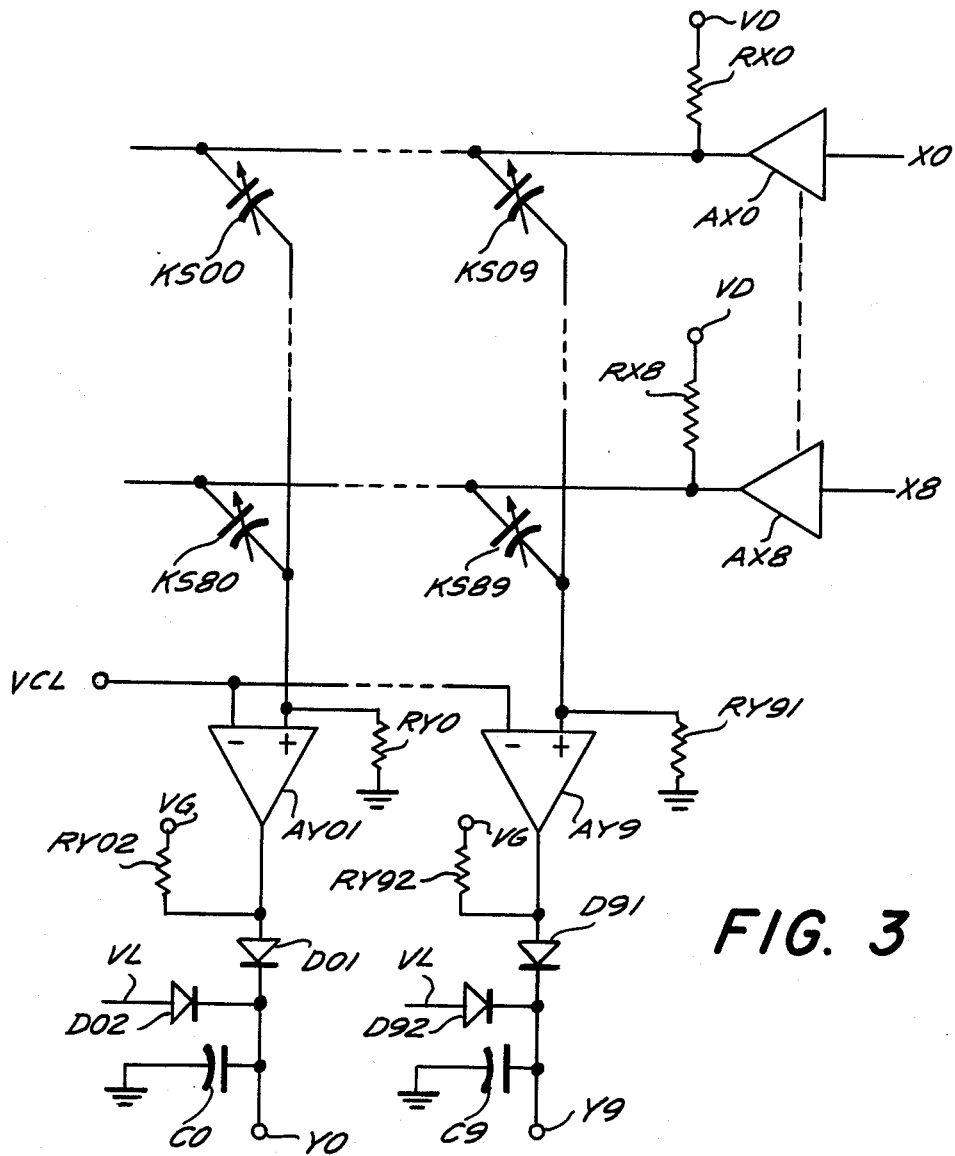
FIG. 3 is a schematic diagrm of the keyboard switch matrix of FIG. 2.

The keyboard switch matrix KBS can be a matrix of up to 90 switches. A typical matrix is shown in FIG. 3 wherein each XN line is connected via an amplifier AXN to a row line of the matrix, and each column line of the matrix is connected via a signal processing circuit to one of the YN lines. At the "intersection" of each row and column line is a key switch KSNN shown as a variable capacitor.

Since at any instant in time the memory KEM is concerned with the state of only one of the switches KSNN, i.e., only one of the lines XN is receiving a packet of pulses and one of the lines YN is connected to the sense amplifier in memory KEM, FIG. 4 shows a typical switch KS89 and its sampling circuitry which can be called a key switch assemblage. The assemblage includes: a source of packets of electrical pulses in the form of amplifier AX8 connected to line X8 which periodically receives bursts or packets of eight pulses from memory KEM; an electrical signal differentiator means DM including variable capacitor KS89 and resistor RY91; a threshold amplifier AY9 which can be an open collector comparator of the type AM50032 made by Advanced Mirco Devices (AMD) 901 Thompson Place, Sunnyvale, Calif. having a (+)—input connected to the output of differentiator means DM and a (−)—input connected threshold level voltage source VCL; and sample and hold integrator SHI including an integrator capacitor C9 connected via a diode D91 to the output of amplifier AY and charging resistor RY93 connected to variable voltage source VG and via a diode D92 to variable voltage source VL. The variable sources are shown by way of example as potentiometers connected across batteries with the taps of the potentiometers connected to filter capacitors.

While the variable capacitor KS89 can take many forms FIG. 5 shows an especially desirable configuration. The variable capacitor KS89 is shown having an electrical circuit including a substrate 10 of insulative material. The pads are "printed" pads 12 and 14 of conductive material. The pads are spaced from each other by a gap 16. The pad is connected via a signal terminal 18 to pulse source PS of FIG. 4 and the pad 14 is connected via a signal terminal 20 to threshold amplifier AY9 of FIG. 4.

Normally packets of pulses are fed to terminal 18 from source PS and are sensed for at terminal 20 by amplifier AY9. The passage of the pulses from terminal 18 and pad 12 to pad 14 and terminal 20 is controlled by capacitive coupling member.

The capacitive coupling member includes a switch stem 22 having a transverse portion 24 at an end opposite the pads 12 and 14. Fixed to the ends of portion 24 is a ribbon 26. The ribbon has a substrate 2 or backing of resilient plastic material such as MYLAR on which has been deposited a layer of metallic material such as aluminum or silver. The metallic material is then covered with a coating of insulating material. The member can be positioned opposite the pads by means of support 28 through which passes switch or key stem 22. The top end of the stem is provided with a key cap 30. Normally the key stem is held in the retracted position as shown. One can use a spring such as a compression spring 32 or interacting magnets.

In addition, there can be provided a bumper 31 of elastic material which acts as a stop for downward travel of the switch stem 22.

The operation of the key assemblage will now be described with the aid of the waveforms of FIG. 6. Periodically, a packet of eight pulses as shown in waveform (a) or (a') is emitted from amplifier AX8 to terminal 18. The variable capacitor KS89 and the resistor RY91 act as a conventional RC- differentiator wherein the leading edge of the pulse is assumed to be transmitted undisturbed while the remainder of the pulse is shaped according to the relationships:

$$e = \frac{RCE}{\tau} - \frac{RCE}{\tau} \cdot \exp\left(\frac{-t}{RC}\right); 0 < t < \tau$$

$$e = \frac{RCE}{\tau} [\exp\left(\frac{\tau}{RC}\right) - 1] \exp\left(\frac{-t}{RC}\right); t > \tau$$

Where $\tau$ is approximate rise time of input waveform; E is steady peak voltage of input waveform; $t$ is time; R is the resistance of resistor RY91; and C is the capacitive of the variable capacitor KS89. For $RC >> \tau$, both equations reduce to the classical approximation $$e \simeq E \exp(-t/RC)$$

Figure 6:
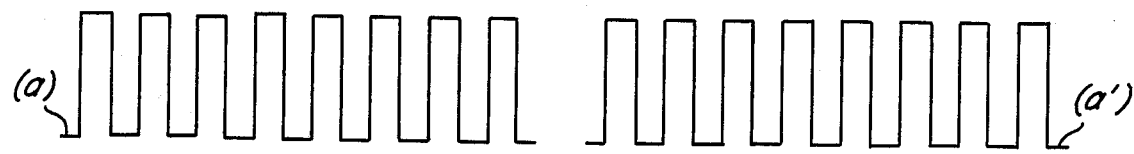
FIG. 6 are signal waveforms useful in explaining the operation of the circuit of FIG. 4.
Figure 6:
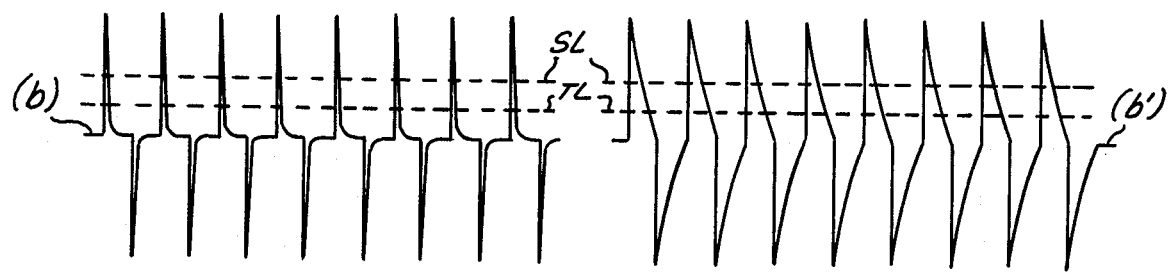
Figure 6:
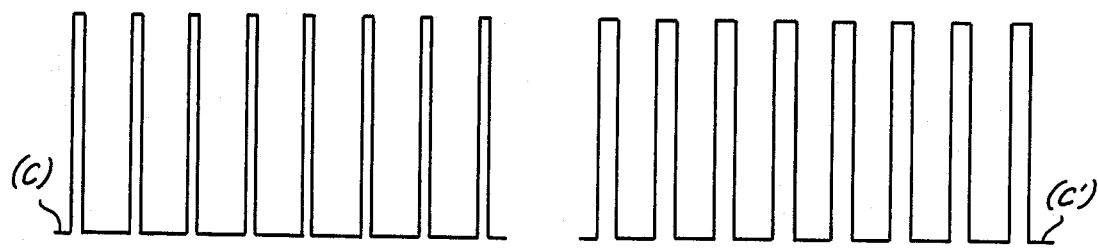
Figure 6:
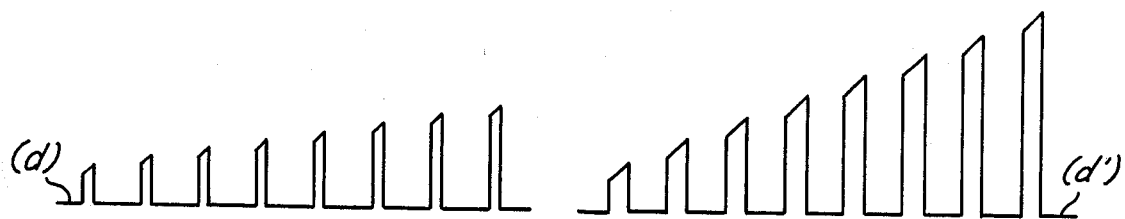
Figure 6:
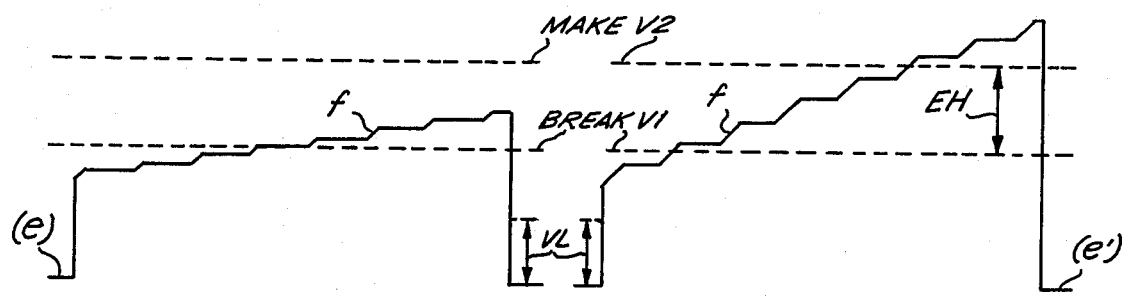

If the capacitance is low when key stem 22 (FIG. 5) is in a slightly depressed position then the waveform (b) of FIG. 6 is fed to amplifier AY9. The amplifier only passes signals above the threshold level TL and clips all signals above its saturation level SL. If the output of amplifier AY9 were not connected to capacitor C9 its output would be that shown in waveform (c). On the other hand when the variable capacitor is set to its maximum value, i.e., when key stem is in its fully propelled position then waveform (b') is fed to the (+)—input of amplifier AY9 whose output, if not connected to capacitor C9, would be waveform (c'). Note the pulses emitted by amplifier AY9 have a width dependent on the instantaneous capacitance of variable capacitor KS89. The instantaneous capacitance and therefore the width of the pulses varies with the travel of key stem 22. The width of the pulses varies between the limits shown in waveforms (c) and (c'). When the output of amplifier AY9 is connected to the integrator SHI these waveforms are modified to waveforms (d) and (d') respectively due to the integration action of capacitor C9 which causes the voltage at terminal T1 to rise according to waveforms (e) and (e') respectively as each pulse adds another quantum of charge onto the capacitor.

The instantaneous voltage across the capacitor C9 follows the equation:

$$Eo = VG + (VL - VG) \exp(-nT/RC)$$

where VL is the amplitude of the added DC voltage; VG is the charging voltage; n is the number of pulses; T is the width of a pulse; R is the resistance of charging resistor RY93; and C is the capacitance of the integrator capacitor C9. Note when $nT$ is zero, i.e., before a key is depressed and the capacitor has been discharged, $Eo = VL$ which is the quiescent DC voltage added to any output signal. Note also that the slope of the tops of the pulses in waveforms (d) and (d') and, therefore, the slope of the risers (f) and (f') is a function of the charging voltage VG. Since the slope of the risers determine the amplitude of the output signal it is seen that by varying the voltage VG the transfer gain between terminal 18 and line Y9 can be varied.

At the end of the eighth pulse of each packet the input impedance to sense amplifier is switched to a very low value such that the capacitor C9 is discharged to the voltage VL.

It will be seen from waveforms (e) and (e') that when the voltage on line Y9 exceeds the level V2 the sense amplifier registered a make condition and when the voltage on the line Y9 is below the level V1 the sense amplifier registered a break condition where the difference between levels V1 and V2 is the electronic hysteresis EH of the sense amplifier.

There has thus been shown a method of controlling the transfer of signals by a capacitor key switch by differentiating a train of high frequency pulses with the variable capacitance of the key switch being used as a differentiating capacitor, applying the resulting output waveform to a voltage comparator so that the output of the comparator is also a train of pulses whose widths are a function of the variable capacitance, and applying the output of the comparator to a sample-and-hold integrating circuit such that the peak amplitude of the final output signal is a function of the width of the comparator output pulses which, in turn, is a function of the amplitude of the differentiated voltage at the input of the comparator which, in turn, is a function of the magnitude of the variable capacitance which, in turn, is a function of the downward travel of the key switch.

Note that the combination of pulse source PS and differentiator means DM can be also considered a signal transducer wherein the mechanical movement of the key stem is transduced into pulses whose width is a function of key stem travel.

Figure 7:
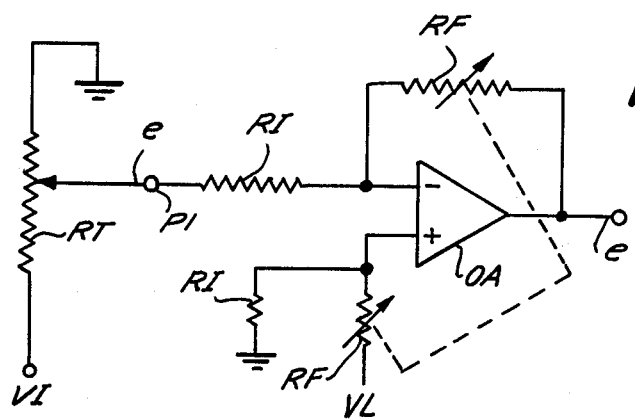
FIG. 7 is another embodiment of the key assemblage.

In FIG. 7 there is another key switch assemblage having a transfer characteristic which can be varied so that a given electrical hysteresis is translated to a greater than usual mechanical hysteresis. In this case a fixed DC voltage is connected to one end of a potentiometer RT whose other end is connected to ground. The tap P1 of the potentiometer which is connected to a key stem (not shown) is connected via resistor RI to (—)—input of operational amplifier OA whose positive input is connected to voltage source VL. The output of the amplifier is connected via variable resistor RF to the (—)—input. The output voltage $e_o$ of the amplifier OA which is fed to a sensing amplifier with electronic hysteresis (not shown) is equal to $$e_o = -(RF/RI) \times e + VL;$$

where e is the voltage at tap P1, RF and RI are the resistances of the feedback and input resistors RF and RI respectively, and VL is a variable reference voltage.

Note when the key is not depressed e is effectively zero and $e_o = VL$ the DC component added to the variable signal. Note also that by varying resistors RF the gain is varied.

Therefore, there has also been shown a method of translating a fixed amount of electronic hysteresis of a terminating sensing amplifier into a significant amount of mechanical hysteresis by adjusting both the gain and D.C. position of the final output signal relative to the actual voltage location of the two fixed electronic hysteresis levels of the sensing amplifier.

While the sensing of key switch travel has been described by width-modulating pulses in accordance with key switch travel and thereafter integrating the width-modulated pulses to obtain an amplitude-modulated signal which is related to key switch travel, it should be apparent that this aspect of the invention contemplates sampling the width-modulated pulses per se for pulses having greater than a given duration to indicate the key switch has travelled greater than a given distance.

There will now be obvious to those skilled in the art many modifications such as different voltage levels, pulse trains, and mechanical details which satisfy many or all of the objects of the invention, but which do not depart from the spirit thereof as defined by the appended claims.

What is claimed is:

1. In a keyboard wherein the mechanical travel of a key monotonically modulates the amplitude of a signal transmitted according to a first transfer function of $p$ volts per inch of travel to a signal sensor having an electronic hysteresis such that separation between the make and break sensing is $m$ volts, the method of increasing the amount of mechanical travel required of the key to change the amplitude of the signal transmitted by $m$ volts comprising the steps of changing the signal amplitude modulation by the key according to a second transfer function similar to the first transfer function but of $q$ volts per inch of travel, where $q$ is less than $p$, and of adding a constant direct voltage to the transmitted signal.

2. The method of controlling the transfer of signals by means of the travel of a key switch between first and second points along a path, said first and second points being associated with first and second signal amplitudes respectively, said method comprising the steps of periodically generating packets of pulses of given duration, monotonically and continuously changing the duration of the pulses in accordance with the monotonically and continuously changing of the position of the key switch along the path, generating a signal having said first and second amplitudes whose amplitude is a function of the changed durations of the pulses, and sensing for the first and second amplitudes of the generated signal associated with the first and second points, respectively.

3. The method of claim 2 wherein said changing step comprises signal differentiating the pulses with a capacitor whose capacitance varies with key travel.

4. The method of claim 3 wherein the step of generating of signal whose amplitude is a function of the changed duration of the pulses comprises signal integrating each packet of pulses with changed duration.

5. Capacitive key switch assemblage comprising: a source of packets of electrical pulses, each of the pulses in the packet being of a fixed given duration; an electrical signal differentiator means, including a resistor and a controllably variable capacitor connected to a keystem and having an input connected to said source and an output, for transmitting from said output for each pulse received at said input a pulse having a duration which is a function of the travel of the keystem; and a sample and hold electrical signal integrator means, connected to the output of said electrical signal differentiator means, for emitting an integrated signal whose amplitude is a function of the durations of the pulses received from said electrical signal differentiating means.

6. The assemblage of claim 5 wherein said sample and hold electrical signal integrator means comprises first and second diodes each having first and second electrodes, the first electrodes of the diodes being connected to a first terminal, means for connecting the second electrode of said first diode to the output of said electrical signal differentiator means, an integrating capacitor connected between said first terminal and a reference voltage source, a charging voltage source, a charging resistor connecting said charging voltage source to the second electrode of said first diode and a DC level voltage source connected to second electrode of said second diode, said second diodes being similarly polarized with respect to said first terminal, and said charging voltage-and-said DC level voltage sources being the same polarity.

7. The assemblage of claim 6 wherein a threshold amplifier connects the output of said electrical signal differentiator means to the second electrode of said first diode.

8. The assemblage of claim 6 further comprising a bistable means connected to the sample and hold electrical signal integrator means for switching to a first state when the level of the integrated signal is greater than first value and switching to a second state when the level of the integrated signal is less than a second value.

9. Capacitive key switch assemblage comprising: a source of packets of electrical pulses, each of the pulses in the packet being of a fixed duration; an electrical signal differentiator means, including a resistor and a controllably variable capacitor connected to a keystem and having an input connected to said source and an output for transmitting from said output for each pulse received at said input a pulse having a trailing edge whose slope is a function of the travel of the keystem; a threshold amplifier means having an input connected to the output of said differentiator means and an output, said threshold amplifier means accepting those portions of each pulse with a variable trailing edge which fall between two signal levels whereby a pulse is transmitted from the output of said threshold amplifier means having a width which is a function of the trailing edge of the pulse received from said differentiating means; and a sample and hold electrical signal integrator means connected to the output of said threshold amplifier means, for emitting an integrated signal whose amplitude is a function of the duration of the signals emitted by said threshold amplifier means.

10. The assemblage of claim 9 further comprising means for varying the gain and D.C. offset level of said sample and hold electrical signal integrator means.

* * * * *